United States Patent [19]

Glass, III et al.

[11] Patent Number: 5,471,138
[45] Date of Patent: Nov. 28, 1995

[54] INDUCTIVE VALVE MOTION SENSOR FOR POSITIONING OUTSIDE THE BODY OF THE VALVE

[76] Inventors: Samuel W. Glass, III, 222 Norfolk Ave., Lynchburg, Va. 24503; Timothy A. Rossman, 107 Edgewood Dr., Lynchburg, Va. 24502; Vedat T. Ataman, 2400G Weeping Willow Dr., Lynchburg, Va. 24501

[21] Appl. No.: 21,376

[22] Filed: Feb. 23, 1993

[51] Int. Cl.⁶ .............................. G01B 7/14; F16K 37/00
[52] U.S. Cl. ............... 324/207.19; 137/554; 324/207.22; 324/207.26; 324/234
[58] Field of Search ........................ 324/207.14, 207.15, 324/207.16, 207.17, 207.22, 207.25, 207.26, 234, 238, 207.19, 657; 137/553, 554

[56] References Cited

U.S. PATENT DOCUMENTS

| | | | |
|---|---|---|---|
| 2,749,509 | 6/1956 | Medlar | 324/657 |
| 3,721,896 | 3/1973 | Mori et al. | 324/234 X |
| 4,109,201 | 8/1978 | Pigeon et al. | 324/238 X |
| 4,485,344 | 11/1984 | de Sivry et al. | 324/234 X |
| 4,777,979 | 10/1988 | Twerdochlib | 137/554 |
| 5,008,841 | 4/1991 | McElroy | 137/553 X |
| 5,140,263 | 8/1992 | Leon | 324/207.17 |
| 5,223,830 | 6/1993 | Romes | 324/207.19 X |

Primary Examiner—Gerard R. Strecker

[57] ABSTRACT

The motion of a DISC for a check valve is tested and sensed by placing coil sensors on the check valve. The coils produce a magnetic field within the valve near the DISC such that the DISC moves through the magnetic field. The coils are connected to a sensing circuit having an LED display. The sensing circuit is also connected with a tape recorder for taping a signal output by the sensing circuit. The recorded signal by the tape recorder can be subjected to further analysis. The LED display of the sensing circuit can also be used to create a stand-alone indicator of valve actuation. An oscillator of the sensing circuit produces a sinusoidal excitation wave which is amplified and transmitted to the coils for producing the magnetic fields. The coils have approximately the same resistance and inductance such that they form a balanced bridge circuit. If the two coils are perfectly balanced, the output from the bridge circuit is zero. If the inductance of either of the coils changes, however, the output of the bridge circuit changes wherein this change is displayed by the LED display while being recorded by the tape recorder for analysis.

3 Claims, 15 Drawing Sheets

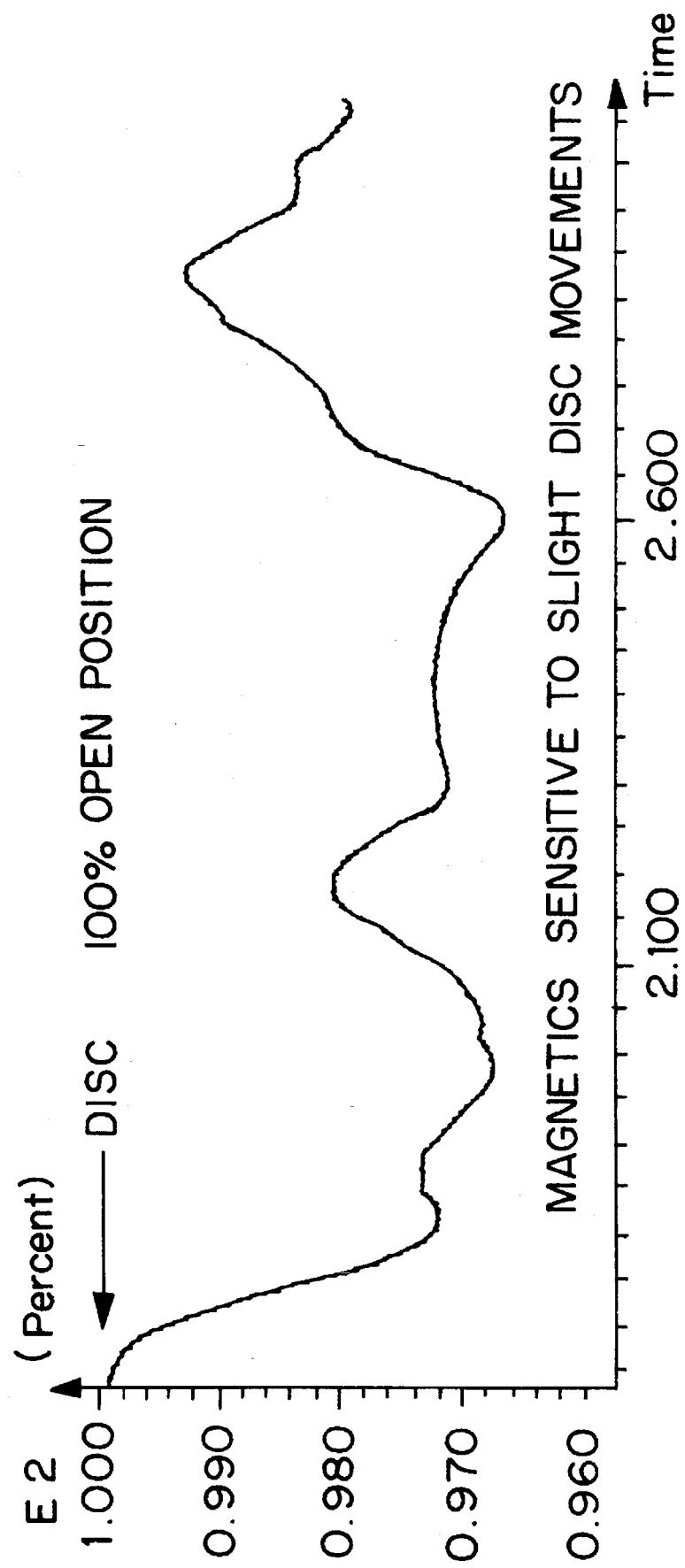

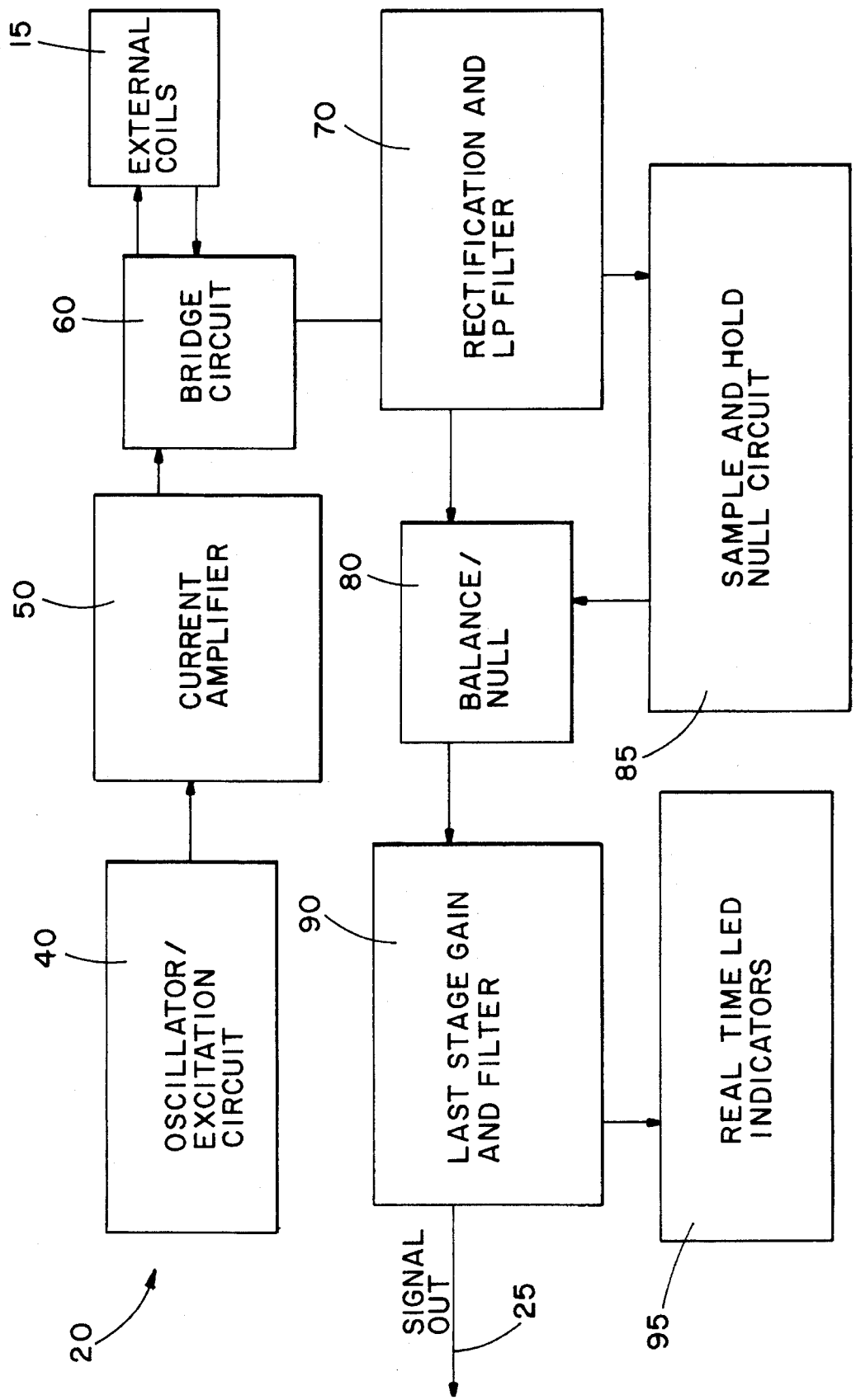

INDUCTIVE VALVE MOTION SENSOR FOR POSITIONING OUTSIDE THE BODY OF THE VALVE

FIELD AND BACKGROUND OF THE INVENTION

The present invention relates in general to the inspection of check valves and in particular to a new and useful system and method of inspecting a check valve through inductive motion sensing. Maintaining reliable operation of check valves in power plants and other industries employing these critical valves requires periodic inspection to insure the valves are operating properly. One method provides for disassembling the check valve and visually examining and inspecting all parts for potential wear and tear. If any worn or defective parts are found they are replaced and the valve reassembled and returned to service. When using this method, it is very common to assemble a valve that appears to be in good condition after disassembling and inspection, however, proves to be ineffective upon reassembly and return to service.

A more cost effective method for inspecting these valves is to verify the valve function without having to disassemble each valve. For those valves that are inspected without disassembling there are several aspects which enter into the functional verification of each valve. One major aspect is the verification of the valve DISC motion.

One technique in verifying functions through valve DISC motion is to use an ultrasonic transducer in order to send a sound pulse through the casing of the valve for reflection off of the DISC. As the DISC moves within the valve, the distance that the sound pulse travels between the casing and the DISC changes. Because of this change, the time delay between the initial pulse from the ultrasonic transducer and the received reflection from the valve DISC is affected. This problem requires that valve be filled or at least partially filled with water or another sound conducting medium for proper inspection. The ultrasonic transducer technique, however, cannot be used for those check valves that are air-filled or gas-filled.

Electromagnetic methods have been used in order to inspect and test check valves without filling with water or a sound conducting fluid. Also, this method has been used on those check valves which otherwise do not support acoustic detection of valve DISC motion. If the valve DISC is made of carbon steel or a ferromagnetic material, it is possible to place a DC magnet of relative strength on one side of the valve and sense fluctuations resulting from the DISC passing through the magnetic field on the other side of the valve using Hall-effect sensors. This method has proved successful for valve casings made of ferromagnetic material and for DISC made of ferromagnetic material. Some sensitivity is also possible for non-ferromagnetic DISC materials.

Another approach for inspecting check valves is to use a pair or a set of coils that are either located on opposite sides of the outside of the valve casing, or in close proximity to one another. This coil arrangement, however, must insure that the coil fields are influenced by the location of the flapper. One of the coils on the valve casing is excited with an AC or sinusoidal excitation. This excitation is typically several volts at 100 to 10,000 hertz. The excitation induces an AC magnetic field in the check valve which coil. Small fluctuations in the current of the second coil are influenced by the motion of the flapper within the magnetic field. These small fluctuations may be amplified to sense the motion of the valve DISC.

A major drawback found in using coils for sensing motion of a valve flapper is that the inductive coil sensor is of simple construction and requires a very large coil in order to produce any significant voltage amplitudes. In some cases, the coil must be wrapped around the valve which can be very difficult to operate in most test environments. Because the voltage and current demands for achieving good sensitivity are very high, large and heavy power amplifiers must be used. Thus, an actual valve test proves to be very cumbersome and costly.

SUMMARY OF THE INVENTION

The present invention provides for an inductive valve motion sensor to be used to detect the motion of a DISC within a check valve. Coils are located on an outer surface of a check valve and positioned such that the motion of the DISC is within the magnetic fields produced by the coils. The coils are connected by coax lines to a sensing circuit. If the DISC the valve passes across the magnetic fields produced by the coils, a voltage change is produced and sensed by the sensor circuit which is, in turn, displayed by light emitting diodes (LEDs) or a LED display located at the sensing circuit. A tape recorder is also connected with the sensing circuit such that the voltage change produced is recorded by the tape recorder. The recorded signal recorded by the tape recorder can then be subjected to analysis by the operator.

The sensing circuit uses an oscillator having an excitation circuit for producing a variable frequency sine wave which is amplified by a current amplifier and sent to a bridge circuit. The bridge circuit sends the sine wave to the external coils which in turn produce a magnetic field for detecting motion by the DISC of the valve. Motion by the DISC is picked up by the coils and transmitted back to the bridge circuit. The bridge amplifier within the bridge circuit outputs the change in the inductance detected by the coils to a rectifier and filter circuit. The output undergoes some amplification within the rectifier and filter circuit before being sent to a sample and hold null circuit for compensating for initial offset or bias in the signal. A balance/null circuit is also used for capturing the signal. A last stage gain and filter circuit having a filter amplifier provides the last stage for filtering the signal before the signal is sent to the tape recorder. A real time LED indicator displays the signal fluctuations.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

In the drawings:

FIG. 4 is a schematic diagram of the sensing circuit of FIG. 1;

DESCRIPTION OF THE PREFERRED EMBODIMENTS

Figure 1:
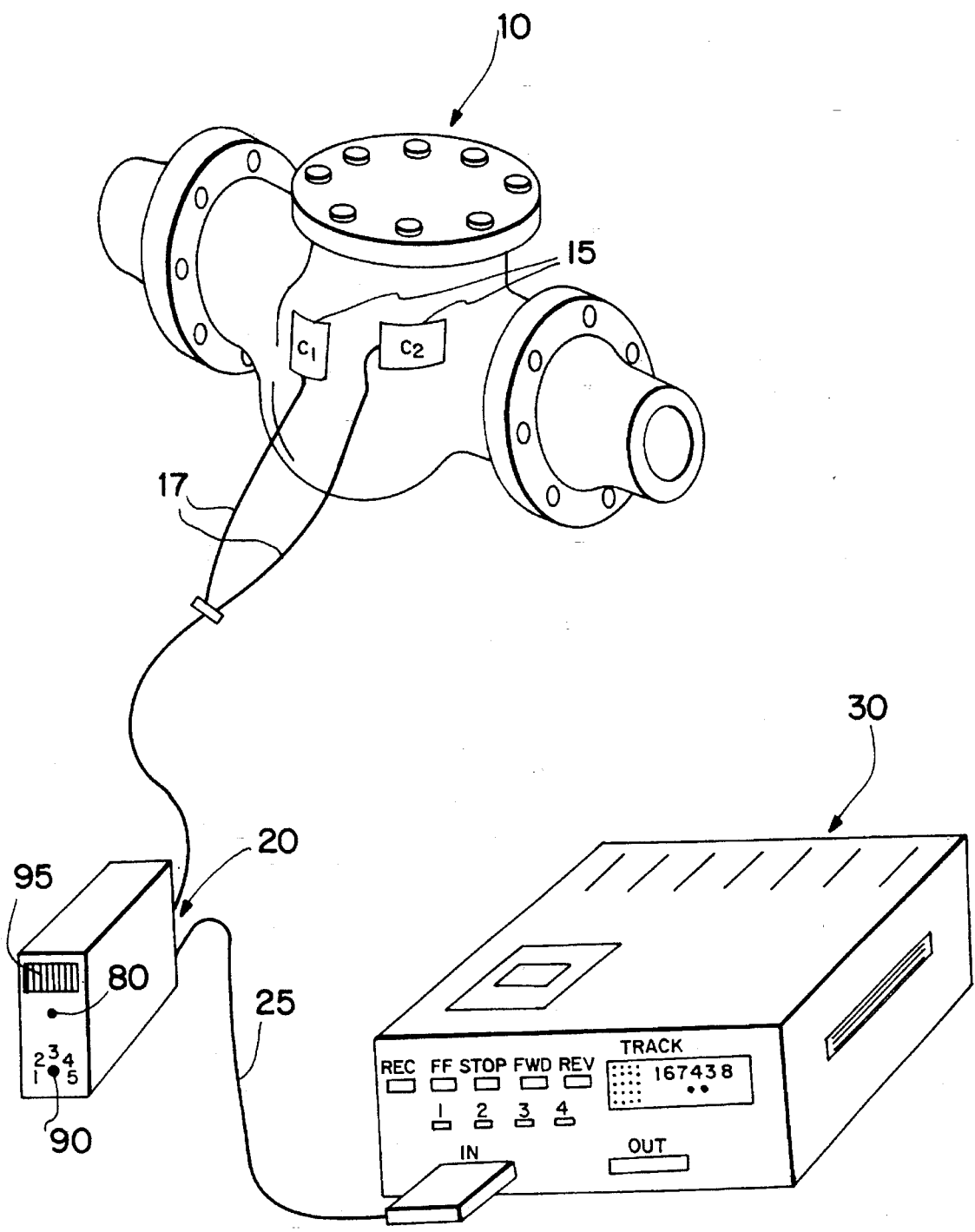
FIG. 1 is a perspective view of a check valve, sensing circuit and tape recorder according to the present invention.
Figure 2:
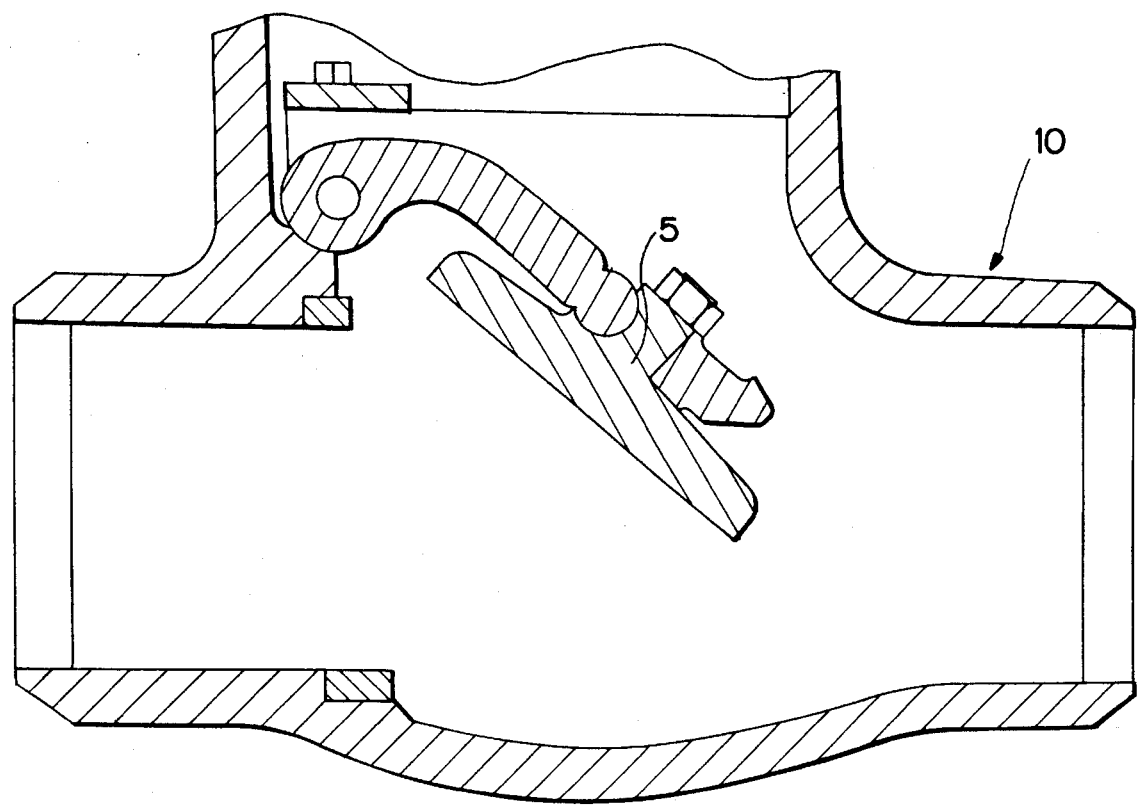
FIG. 2 is a cross sectional view of the check valve of FIG. 1.

FIG. 1 illustrates a check valve generally designated 10, having coil sensors 15 placed on the valve 10 for detecting motion of a valve DISC 5 as shown in FIG. 2. Motion of the DISC 5 of the valve 10 is undertaken within the magnetic field produced by the coil sensors 15. The change in the coil magnetic field detected by the coil sensors 15 is transmitted through coax lines 17 to a sensing circuit generally designated 20. The sensing circuit 20 senses the voltage change caused by the DISC 5 and displays this change on a LED indicator 95 while recording this signal on a tape recorder generally designated 30 through a signal line 25 joined from the sensing circuit 20 to the tape recorder 30.

The LED display 95 on the sensing circuit 20 provides a real time signal for an operator performing the test for DISC motion. By recording the signal on the tape recorder 30, subsequent analysis of the signal is made possible. FIG. 3 illustrates a typical signal that is transmitted and recorded by the tape recorder 30. The LED display 95 may also be used to create a stand-alone indicator of the valve actuation.

The inductive bridge valve motion sensor according to the present invention uses two small coils 15 which can have an effective radius of 0.5 to 1.5 inches. The coils 15 can be mounted in flat protective cases which can be closely adhered to the body of the valve 10. The coils 15 can be oval shaped such that one long coil axis is available in order to force the magnetic field deeper into the shell of the valve 10. The coils 15 are positioned such that their magnetic fields can extend into the area where the valve DISC 5 is insured of crossing these fields.

Figure 5:
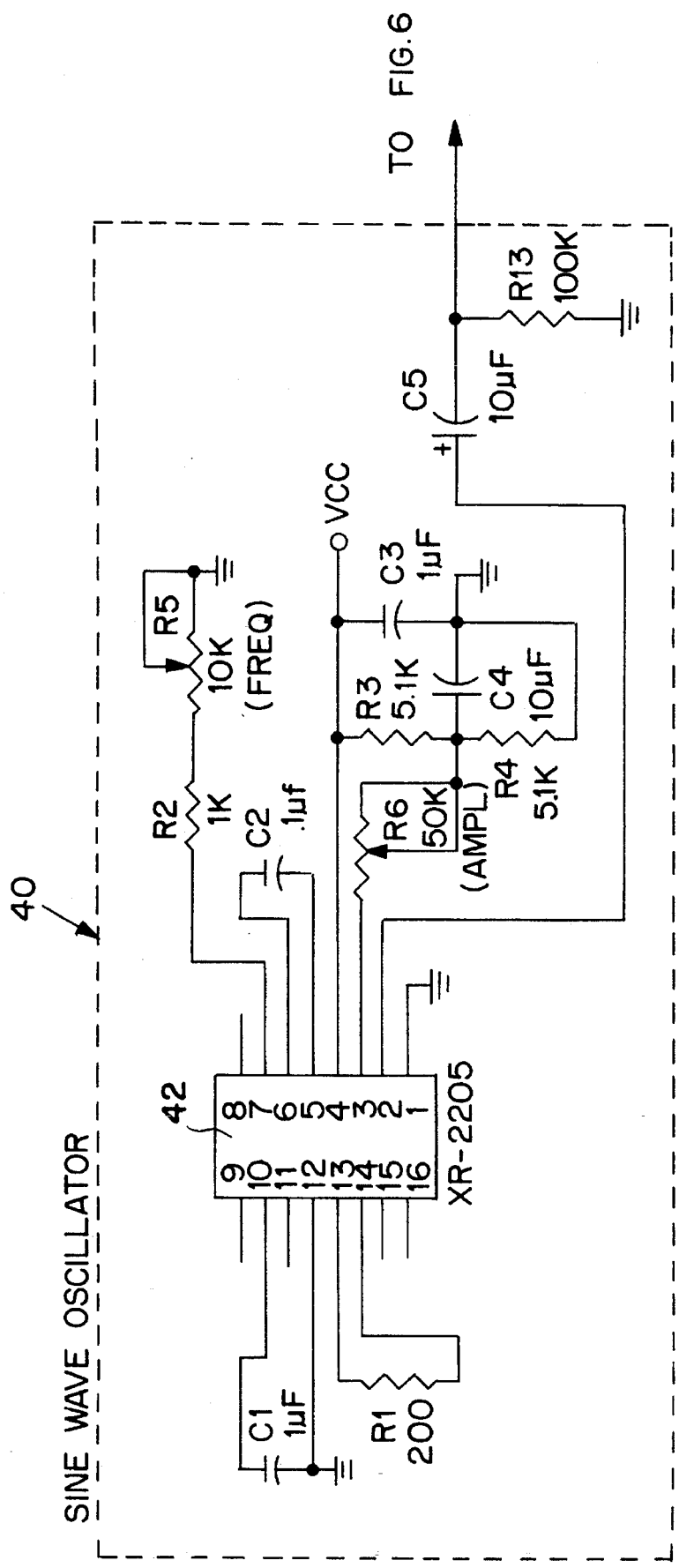
FIG. 5 is a schematic diagram of a sine wave oscillator of the sensing circuit of FIG. 1.
Figure 6:
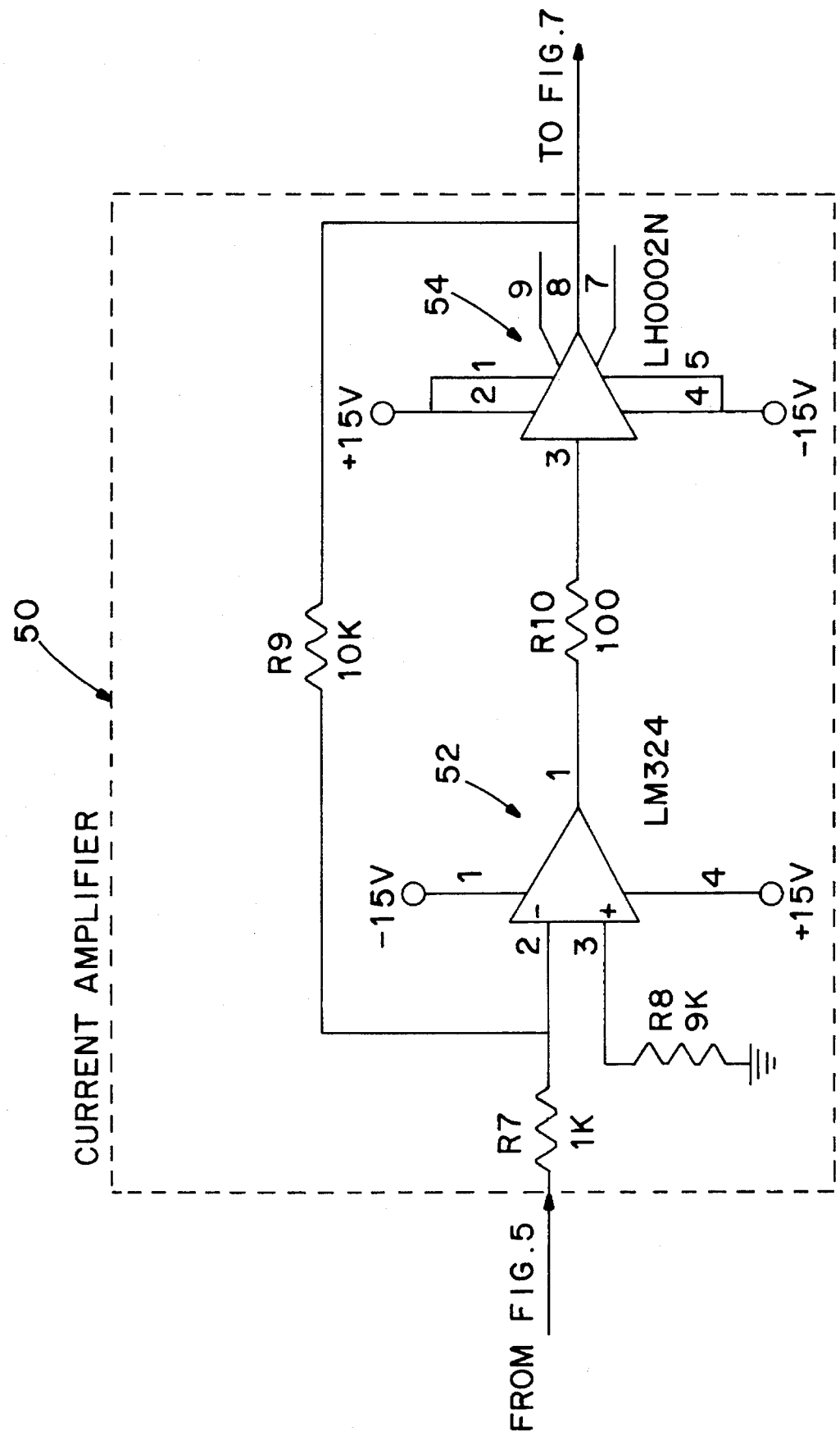
FIG. 6 is a schematic diagram of a current amplifier of the sensing circuit of FIG. 1.
Figures 1, 13:
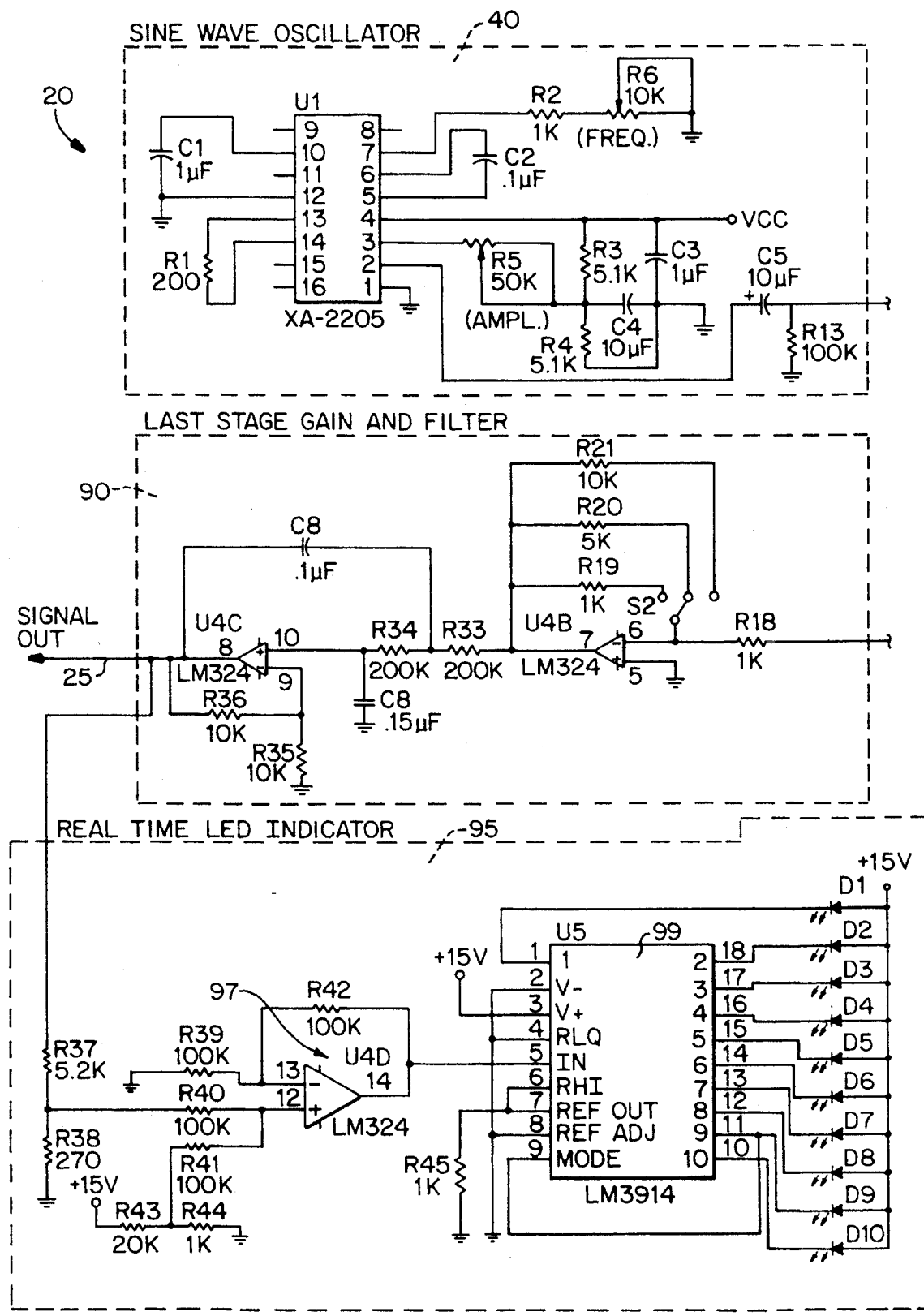
FIG. 13 is a schematic diagram of the sensing circuit of FIG. 1 incorporating the circuits of FIGS. 5–12.
Figures 2, 13:
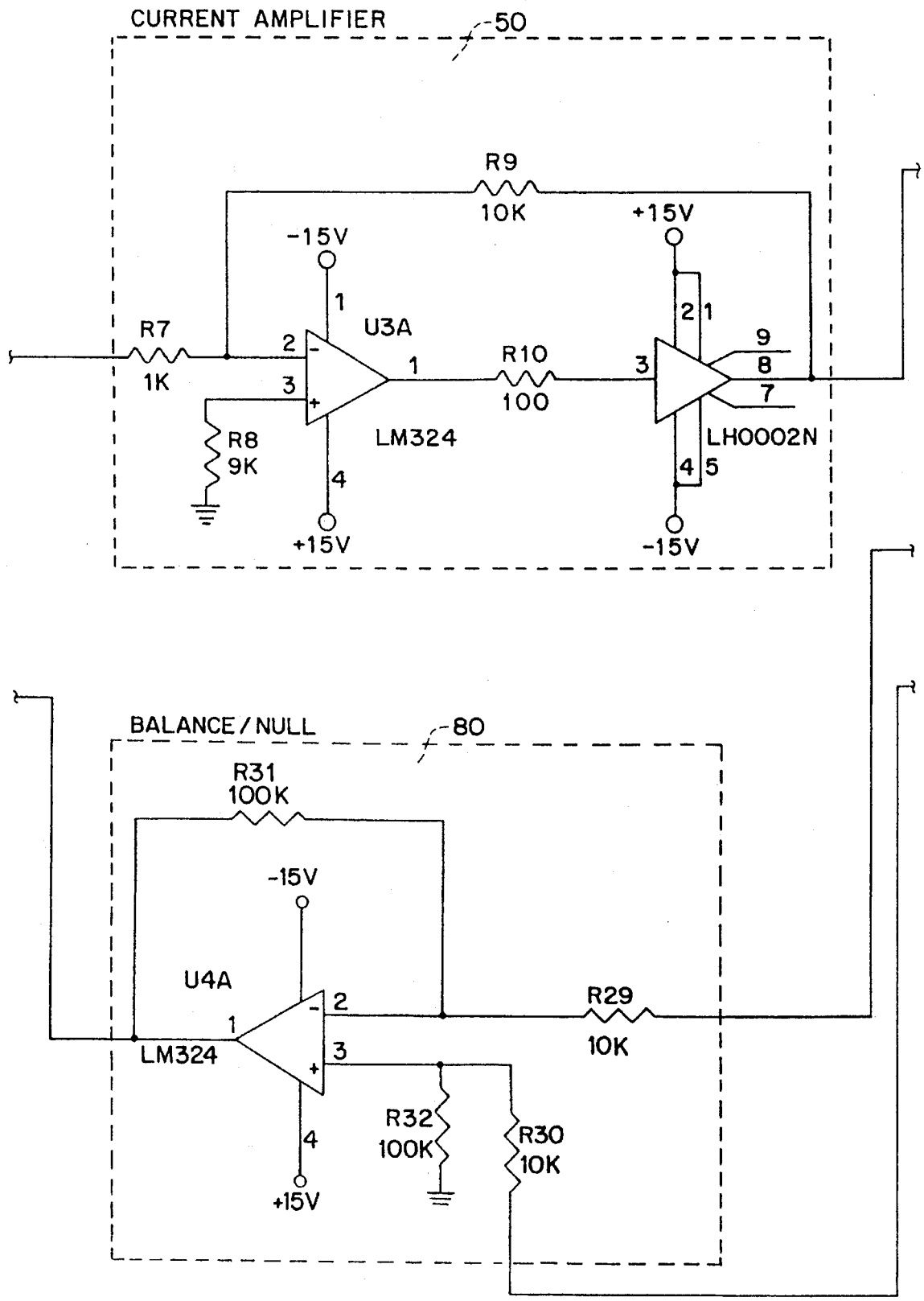
Figures 3, 13:
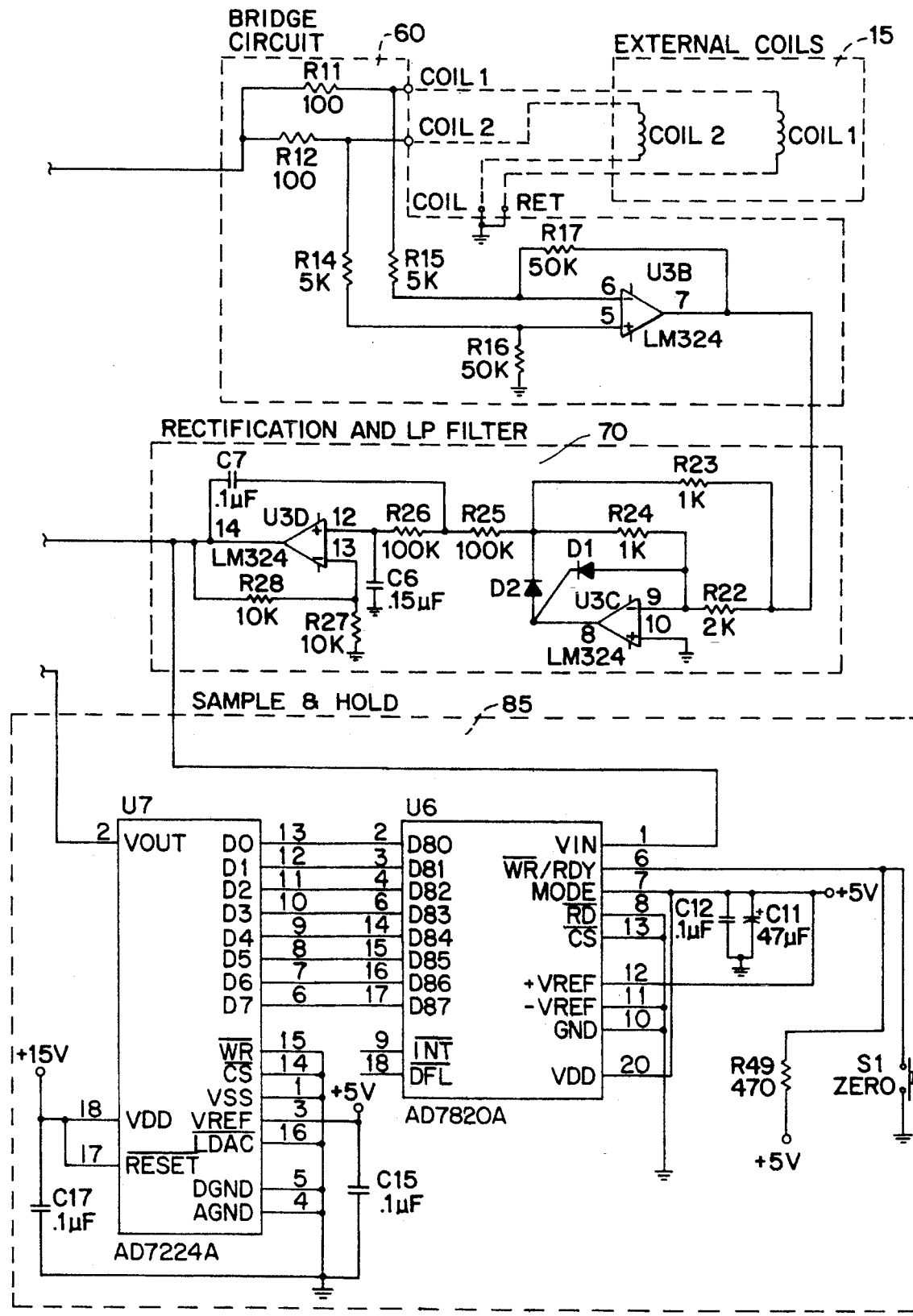
FIG. 3 is a display of a recorded signal for the tape recorder of FIG. 1.

FIGS. 4 and 13 illustrate the sensing circuit 20 comprising a sine wave oscillator 40 as shown in FIG. 5. The sine wave oscillator 40 has an excitation circuit 42 for producing a variable frequency sine wave which is buffered and amplified by a constant current amplifier 50. FIG. 6 shows that the current amplifier 50 has amplifiers 52 and 54 for amplifying the sine wave and sending the sinusoidal excitation signal to a bridge circuit 60.

Figure 7:
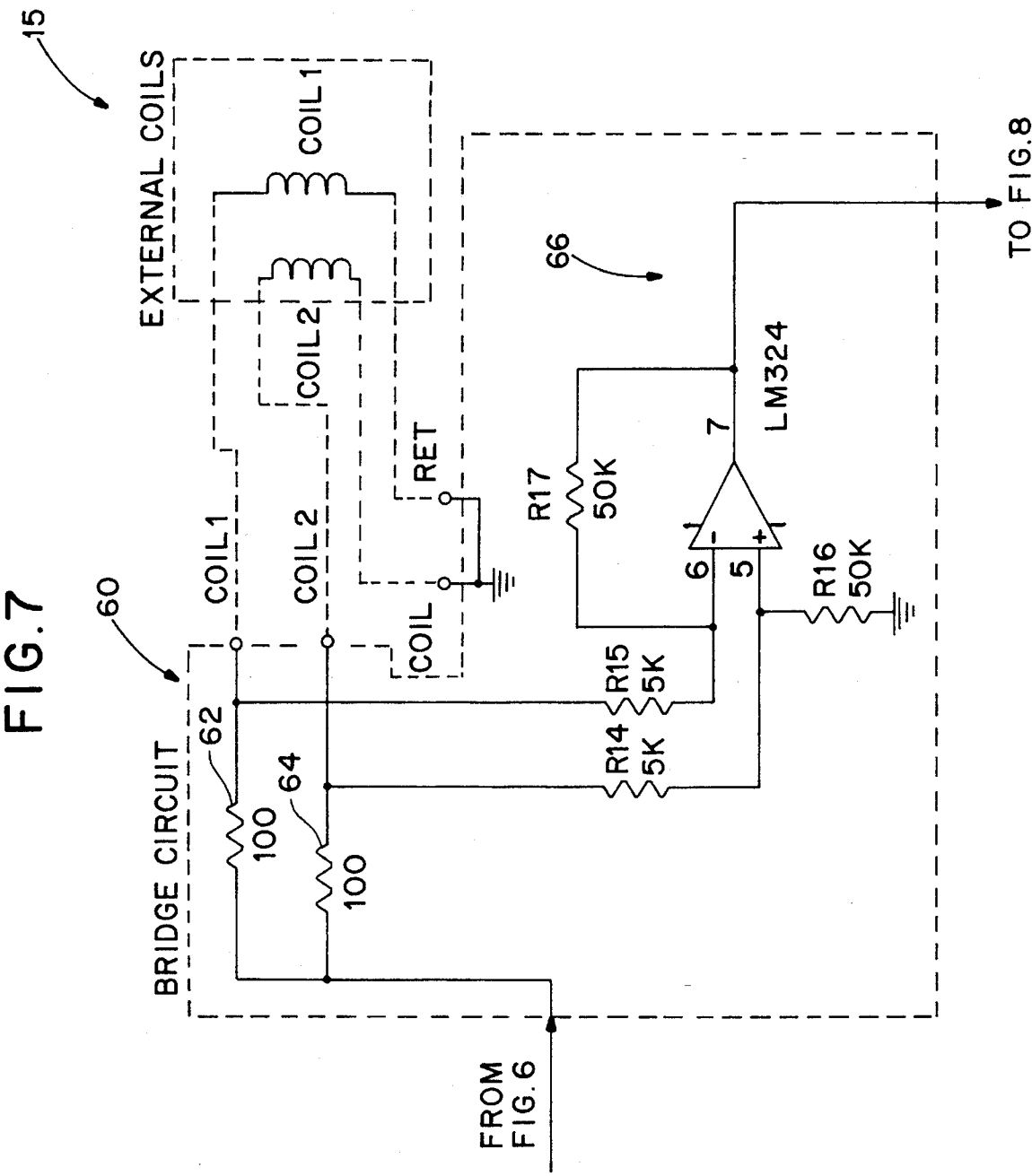
FIG. 7 is a schematic diagram of a bridge circuit of the sensing circuit of FIG. 1.

The sinusoidal excitation signal is sent through matched dropping resistors 62 and 64 of the bridge circuit 60 to the external coils 15 as shown in FIG. 7. The coils 15 have approximately the same resistance and inductance such that the coils 15 form a balanced bridge circuit 60 provided to a bridge output 66. If the coils 15 are perfectly balanced, the bridge output 66 is zero. If the inductance of either of the coils 15 changes, the bridge output 66 will reflect these changes.

Figure 8:
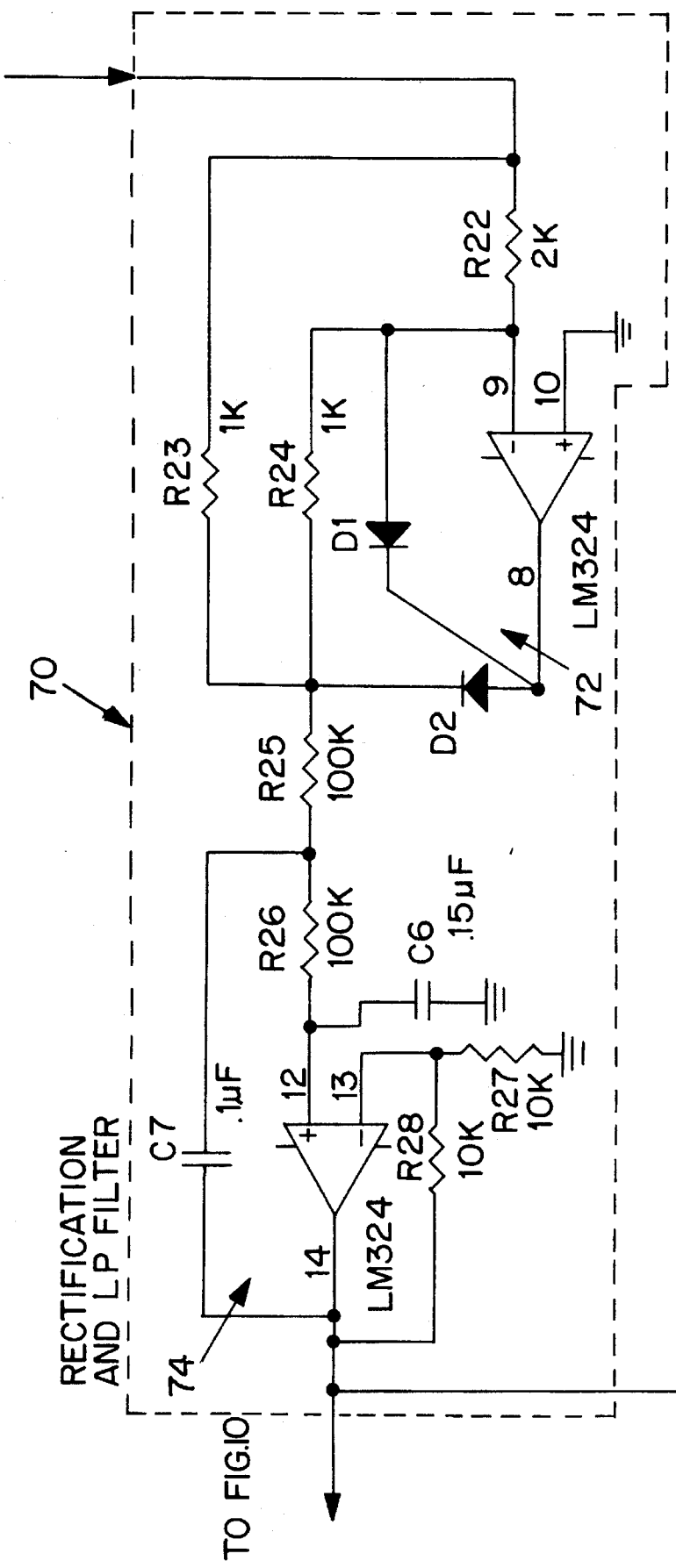
FIG. 8 is a schematic diagram of a rectification and filter circuit of the sensing circuit of FIG. 1.

FIG. 8 illustrates that a rectification and LP filter 70 receives the bridge output 66 amplified by the bridge circuit 60. The signal received from the bridge amplifier output 66 goes to a rectifier circuit 72 which further amplifies the signal and sends the signal to an LP filter circuit 74 which also subjects the signal to amplification.

Figure 9:
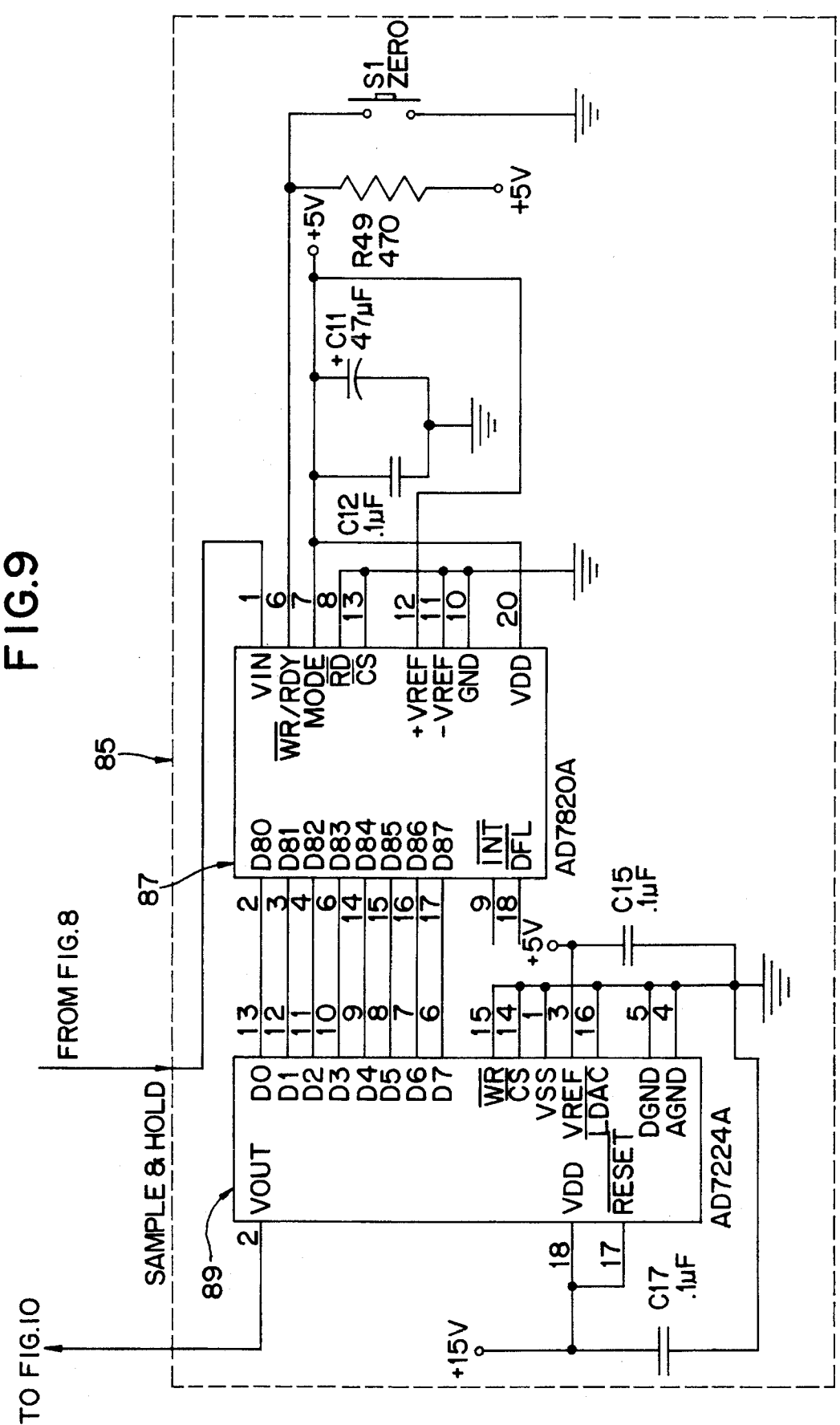
FIG. 9 is a schematic diagram of a sample and hold circuit of the sensing circuit of FIG. 1.

FIG. 9 shows a sample and hold null circuit 85 which is used to compensate for some initial offset of bias in the signal A sample circuit 87 samples the signal and sends the signal to a hold circuit 89. The amplitude of the signal can be captured at any particular point in time by an operator activating the sample and hold null circuit 85 through use of a means such as a momentary switch.

Figure 10:
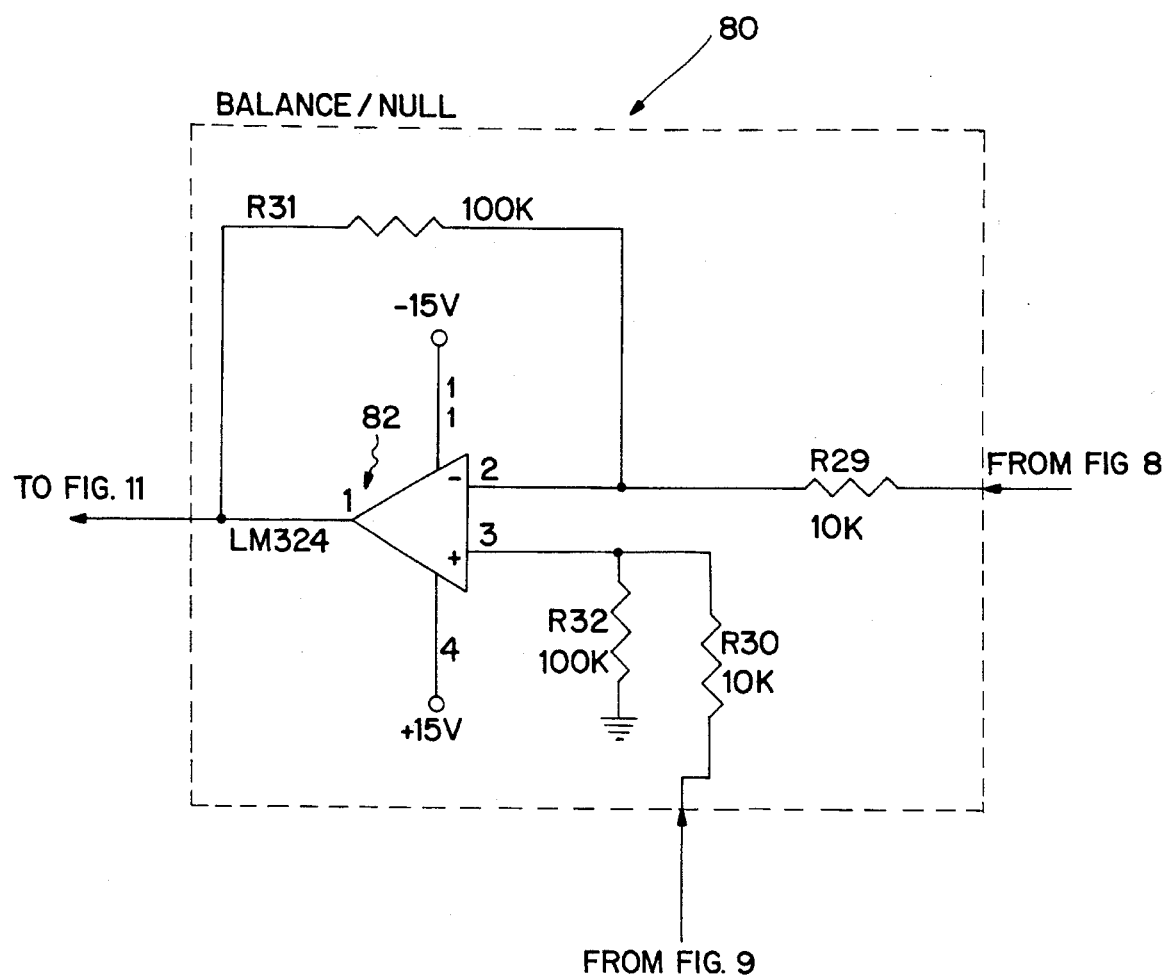
FIG. 10 is a schematic diagram of a balance/null circuit of the sensing circuit of FIG. 1.
Figure 11:
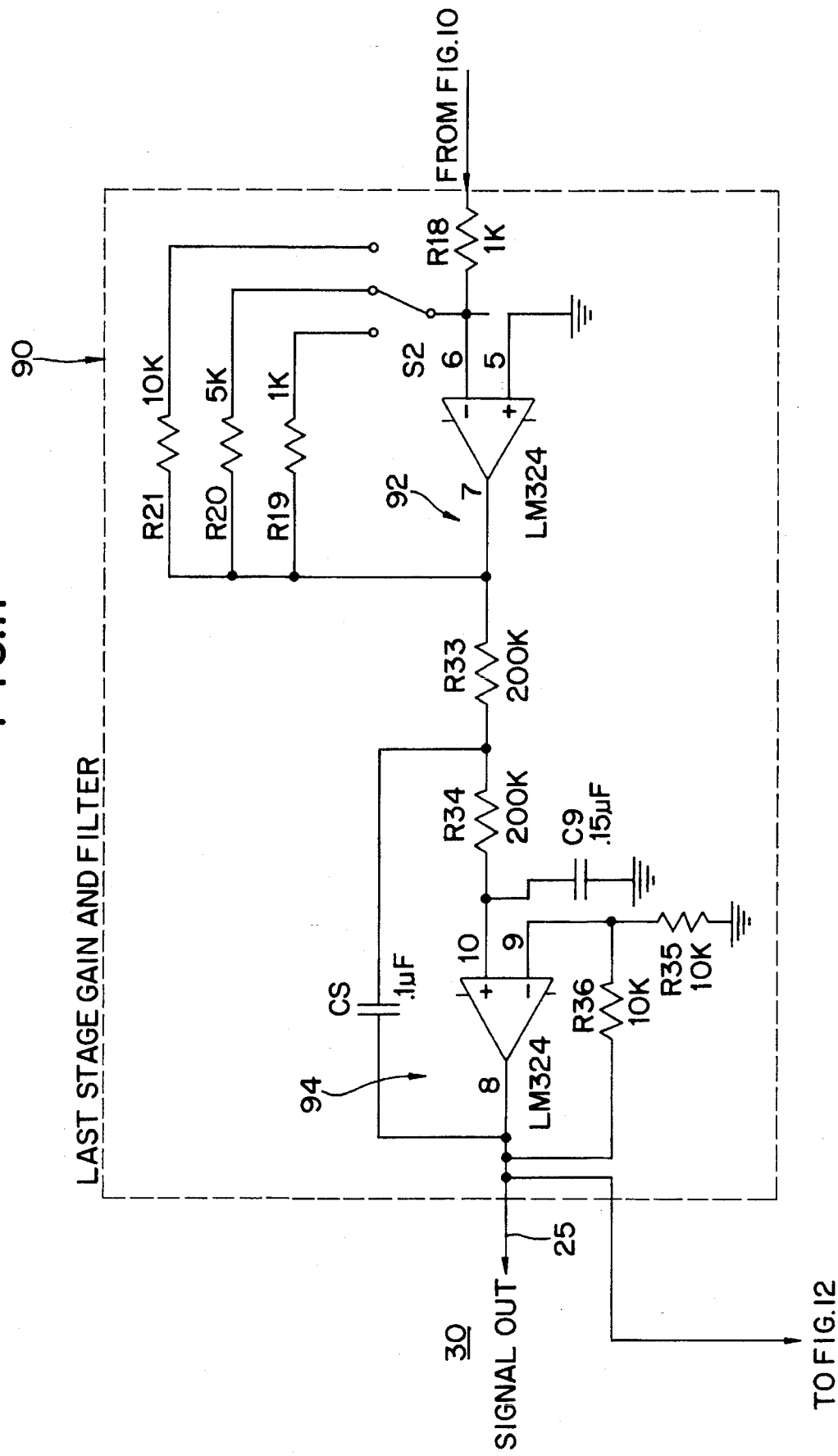
FIG. 11 is a schematic diagram of a last stage gain and filter circuit of the sensing circuit of FIG. 1.

The held signal within the sample and hold null circuit 85 is transmitted to a balance/null circuit 80 having a balance amplifier 82 for subtracting the amplitude from the captured signal as shown in FIG. 10. The signal is then sent to a last stage gain and filter circuit 90 having a gain amplifier 92 for further amplification of the signal and providing variable gain for the last stage of the signal as illustrated in FIG. 11. A filter amplifier 94 receives the signal from the gain amplifier 92 and provides a last stage of filtering before the signal is sent to the tape recorder 30 through the signal line 25.

Figure 12:
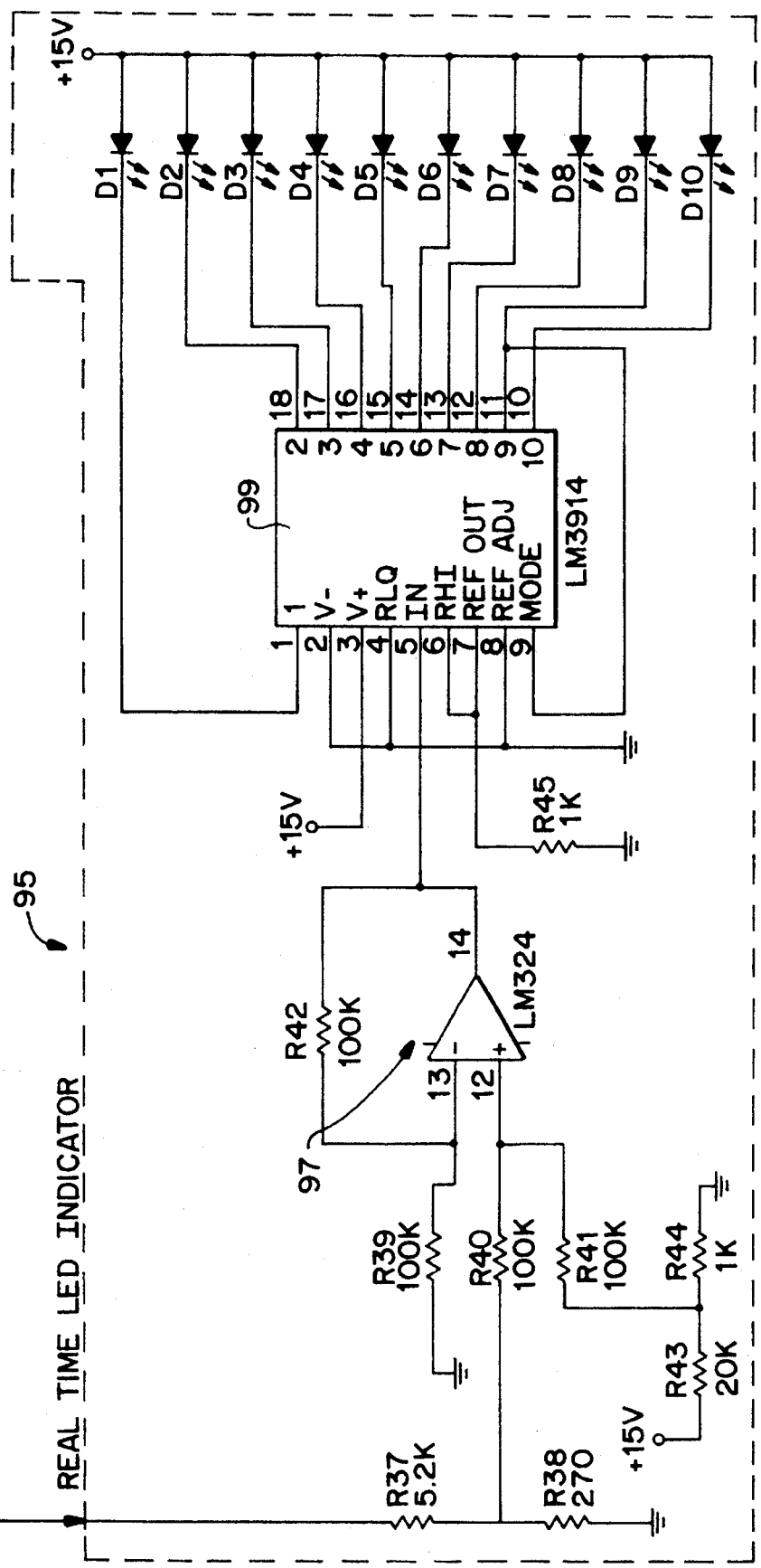
FIG. 12 is a schematic diagram of a LED indicator circuit of the sensing circuit of FIG. 1.

FIG. 12 shows that the LED indicator circuit 95 is parallel to the output signal sent to the tape recorder 30 and also receives the output signal from the filter amplifier 94. This output signal is amplified by an LED amplifier 97 and transmitted to a bank drive 99 for driving a bank of LEDs thereby giving an instantaneous feedback or fluctuations.

The impedance of the coils 15 changes as a result of the presence of the conductive medium in the magnetic field. As this conductive medium moves through the magnetic field, eddy currents are generated in the conductive medium. This conductive material effectively alters the impedance of the coils 15 thereby changing the input to the bridge balance circuit; 60 which is transmitted from the bridge circuit 60 by the bridge output 66. Very small changes in the impedance of the coils 15 result in significant changes transmitted by the bridge output 66.

Several advantages are gained by using the present invention in testing check valves 10. One advantage is that the inductive bridge circuit 60 permits small coils 15 to be used while still providing large amplitude fluctuations of the voltage at the sensing circuit 20.

A second advantage is that high voltages or high currents in the coils 15 are not necessary because the coils 15 are configured in a balanced bridge arrangement. This arrangement also reduces coil heating problems and permits light and compact electronics to be used for driving and sensing coil response.

A third advantage is that the inductive bridge circuit 60 does not require ferromagnetic material in the flapper 5 to perform successful tests as would be required in a Hall sensor DC magnetic approach.

A fourth advantage is that acoustically conducted fluids are not required within the valve 10 for transmitting a pulse from the valve 10 to the DISC 5.

A fifth advantage is that the sensing circuit is robust, rugged and compact such that the sensing circuit 20 can be contained in field-worthy packaging.

A sixth advantage is that the use of the tape recorder 30 permits the simultaneous recording of other data for correlation studies of the motion of the valve DISC 5 with respect to other functions of the valve 5.

A seventh advantage is that the bank of LED indicators 95 provides real time feedback as to whether or not valve 5 motion is being sensed. The LED indicators may be used to create a stand-alone valve actuation verification system.

An eighth advantage is that the bridge circuit permits a variation in the setup of the coils 15. A possible configuration for the coils 15 is for one coil to be attached to the valve 10 while the other coil is used as a reference coil.

While a specific embodiment of the invention has been shown and described in detail to illustrate the application of the principles of the invention, it will be understood that the invention may be embodied otherwise without departing from such principles.

What is claimed is:

1. A system for inductively inspecting a valve having an internal moving part within a body of the valve, from outside the body of the valve, the system comprising:

at least one inductive coil mounted to an outer surface of the body of the valve for projecting a magnetic field into the body such that the moving part can move across the magnetic field;

sensing means connected to the inductive coil for detecting movement by the moving part through the magnetic field produced by the coil, the sensing means generating an output signal corresponding to any movement of the part, the sensing means comprising an oscillator for generating an excitation signal, the excitation signal being provided to the inductive coil for producing the magnetic field, a bridge circuit connected to the coil for detecting a change in the magnetic field caused by any movement of the part within the magnetic field, the bridge circuit providing the output signal corresponding to any movement of the part within the magnetic field, at least one amplifier connected between the oscillator and the bridge circuit for amplifying the excitation signal, an amplifier in the bridge circuit for amplifying the output signal, a rectification and low pass filter circuit connected to the bridge circuit for rectifying and filtering the output signal, a sample and hold circuit connected to the rectification and low pass filter circuit for sampling the output signal at a selected sample time, a balance and null circuit connected to the sample and hold circuit for receiving the sampling of the output signal, and being connected to the rectification and low pass filter circuit for receiving the output signal, the balance and null circuit including a balancing amplifier for receiving the output signal from the rectification and low pass filter circuit and the sampling of the output signal from the sample and bold circuit, and a last stage gain and filter circuit connected to the balance and null circuit for a final gain control and filtering of the output signal;

display means connected to the last stage gain and filter circuit for displaying the output signal; and recording means connected to the last stage gain and filter circuit for recording the output signal.

2. The system according to claim 1, wherein the display means is a light emitting diode (LED) display.

3. The system according to claim 2, wherein the recording means is a tape recorder.

* * * * *